(12) United States Patent
Masuda

(10) Patent No.: US 7,846,491 B2
(45) Date of Patent: Dec. 7, 2010

(54) SURFACE RECONSTRUCTION METHOD FOR SILICON CARBIDE SUBSTRATE

(75) Inventor: Takeyoshi Masuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 266 days.

(21) Appl. No.: 11/664,318

(22) PCT Filed: Mar. 2, 2006

(86) PCT No.: PCT/JP2006/303936

§ 371 (c)(1),
(2), (4) Date: Mar. 30, 2007

(87) PCT Pub. No.: WO2006/137192

PCT Pub. Date: Dec. 28, 2006

(65) Prior Publication Data

US 2008/0050844 A1 Feb. 28, 2008

(30) Foreign Application Priority Data

Jun. 23, 2005 (JP) ............................. 2005-183101

(51) Int. Cl.
B32B 43/00 (2006.01)

(52) U.S. Cl. ............... 427/140; 427/255.18; 427/397.7; 117/95; 117/97

(58) Field of Classification Search .................. 427/140, 427/397.7, 255.18; 117/94, 95, 97
See application file for complete search history.

(56) References Cited

U.S. PATENT DOCUMENTS

| | | | | |
|---|---|---|---|---|
| 6,214,108 B1 * | 4/2001 | Okamoto et al. | ............... | 117/95 |
| 6,273,950 B1 * | 8/2001 | Kitabatake | ................... | 117/95 |
| 6,593,209 B2 * | 7/2003 | Kurtz et al. | ................. | 438/431 |
| 6,734,461 B1 * | 5/2004 | Shiomi et al. | .................. | 257/77 |

FOREIGN PATENT DOCUMENTS

| | | | |
|---|---|---|---|
| EP | 1 493 848 | | 1/2005 |
| JP | 2001-130998 | | 5/2001 |
| JP | 2001130998 A | * | 5/2001 |
| JP | 2001-158697 | | 6/2001 |
| JP | 2003-300797 | | 10/2003 |
| JP | 2004-172556 | | 6/2004 |
| JP | 2004-292305 | | 10/2004 |
| JP | 2005-126248 | | 5/2005 |

OTHER PUBLICATIONS http://www.siliconfareast.com/oxidation.htm, 2004.*
Machine translation of Yano.*

* cited by examiner

Primary Examiner—Frederick J Parker
Assistant Examiner—Alex Rolland
(74) Attorney, Agent, or Firm—Fish & Richardson P.C.

(57) ABSTRACT

A surface reconstruction method for a silicon carbide substrate includes a silicon film forming step of forming a silicon film on a surface of the silicon carbide substrate and a heat treatment step of heat-treating the silicon carbide substrate and the silicon film without providing a polycrystalline silicon carbide substrate on a surface of the silicon film. Here, after the heat treatment step, a silicon film removal step of removing the silicon film may be included. Further, a silicon oxide film forming step of oxidizing the silicon film after the heat treatment step to generate a silicon oxide film, and a silicon oxide film removal step of removing the silicon oxide film may be included.

7 Claims, 2 Drawing Sheets

(A)

(B)

(C)

SURFACE RECONSTRUCTION METHOD FOR SILICON CARBIDE SUBSTRATE

TECHNICAL FIELD

The present invention relates to a surface reconstruction method for a silicon carbide substrate. In particular, the invention relates to a surface reconstruction method for a silicon carbide substrate that can more simply close micropipes in a surface of the silicon carbide substrate.

BACKGROUND ART

Silicon carbide (SiC) has a band gap approximately three times wider, a breakdown voltage approximately ten times higher, a saturated electron drift velocity approximately twice higher, and a thermal conductivity approximately three times higher, than those of silicon (Si), and thus silicon carbide has the characteristics that are not in silicon. Further, silicon carbide is a thermally and chemically stable semiconductor material. Therefore, it is expected that a device using a silicon carbide substrate is employed as a power device that surmounts physical limitations of a device using silicon or as an environment-resistant device operating at high temperatures.

For optical devices, a material development of gallium nitride (GaN) aiming at shorter wavelengths is studied. The lattice mismatch of silicon carbide with respect to gallium nitride is significantly smaller than those of other compound semiconductors. Therefore, a silicon carbide substrate is of interest as a substrate for epitaxial growth of gallium nitride.

Such a silicon carbide substrate can be obtained by slicing, to a predetermined thickness, a single crystal silicon carbide manufactured for example by the modified Lely method. The modified Lely method is the method according to which a crucible made of graphite is provided in which a seed crystal substrate of single crystal silicon carbide is disposed in an upper portion of the crucible and silicon carbide crystal powder is contained in a lower portion thereof, an inert-gas atmosphere is provided inside the crucible, thereafter the silicon carbide crystal powder is heated to sublime the silicon carbide crystal powder, the vapor resultant from the sublimation is diff-used in the inert gas, transported to a region near the seed crystal substrate and recrystallized near the surface of the seed crystal substrate set at a low temperature, and the single crystal silicon carbide is grown on the surface of the seed crystal substrate.

The silicon carbide substrate thus obtained using the modified Lely method, however, has a problem of generating many micropipes that have openings in a surface of the silicon carbide substrate and are hollow crystal defects extending in the direction of the c-axis.

Accordingly, Japanese Patent Laying-Open No. 2004-292305 (Patent Document 1) for example discloses a method according to which a seed crystal substrate of single crystal silicon carbide and a polycrystalline silicon carbide substrate are laid on each other with a silicon source therebetween, they are contained in an airtight container, thereafter the seed crystal substrate and the polycrystalline silicon carbide substrate are heated to 1400° C. to 2300° C., the silicon source between the substrates is melted into a ultrathin silicon melt that is present between the substrates, and single crystal silicon carbide is grown on the seed crystal substrate by liquid phase epitaxial growth. The resultant micropipe density is $1/cm^2$ or less.

According to this method, in the heating to 1400° C. to 2300° C., the silicon melt, which enters the portion between the seed crystal substrate and the polycrystalline silicon carbide substrate located on the seed crystal substrate, forms a silicon melt layer of approximately 30 μm to 50 μm in thickness at the interface between these substrates. The silicon melt layer becomes thinner as the heating temperature rises to finally become approximately 30 μm in thickness. Then, carbon atoms flowing out from the polycrystalline silicon carbide substrate are supplied through the silicon melt layer onto the seed crystal substrate, and the single crystal silicon carbide is grown on the seed crystal substrate by liquid phase epitaxial growth. It is disclosed that, in a surface of the liquid-phase epitaxially grown single crystal silicon carbide, the micropipe defect density is $1/cm^2$ or less.

Patent Document 1: Japanese Patent Laying-Open No. 2004-292305

DISCLOSURE OF THE INVENTION

Problems to be Solved by the Invention

Regarding the method disclosed in Patent Document 1, however, it is difficult to control impurities for crystal growth in liquid phase, and a problem here is that it is impossible to form or keep an ultralow concentration layer, which is necessary for the high breakdown voltage device and-in which mixture of impurities is hindered to an extreme degree. According to this method, it is necessary to separately prepare the seed crystal substrate, the polycrystalline silicon carbide substrate, the silicon source and the closed container for example and contain the seed crystal substrate and the polycrystalline silicon carbide substrate in the closed container in the state where the substrates are laid on each other with the silicon source therebetween, and a problem here is that the preparation itself entails considerable work. Further, according to this method, it is necessary to liquid-phase epitaxially grow the single crystal silicon carbide in the state where the silicon melt layer on the surface of the seed crystal substrate is present between the substrates, and thus a problem here is that the silicon melt layer is difficult to control and considerable time is required for the growth of the single crystal silicon carbide. Furthermore, while the single crystal silicon carbide is grown, the impurity concentration near the growth surface changes at any time and thus a problem here is that control of impurities is difficult.

In view of the above-described circumstances, an object of the present invention is to provide a surface reconstruction method for a silicon carbide substrate that can more simply close micropipes in a surface of the silicon carbide substrate without epitaxial growth of silicon carbide crystal on the surface of the silicon carbide substrate.

Means for Solving the Problems

The present invention is a surface reconstruction method for a silicon carbide substrate, including: a silicon film forming step of forming a silicon film on a surface of the silicon carbide substrate; and a heat treatment step of heat-treating the silicon carbide substrate and the silicon film without providing a polycrystalline silicon carbide substrate on a surface of the silicon film.

Here, preferably the surface reconstruction method for the silicon carbide substrate according to the present invention includes the step of performing, before forming the silicon film, planarization by etching or polishing of the surface of the silicon carbide substrate.

Further, the surface reconstruction method for the silicon carbide substrate according to the present invention may include a silicon film removal step of removing the silicon film after the heat treatment step.

Further, the surface reconstruction method for the silicon carbide substrate according to the present invention may include a silicon oxide film forming step of oxidizing the silicon film after the heat treatment step to generate a silicon oxide film, and a silicon oxide film removal step of removing the silicon oxide film.

Further, according to the surface reconstruction method for the silicon carbide substrate of the present invention, the silicon film may be formed by sputtering or vapor deposition method.

Further, according to the surface reconstruction method for the silicon carbide substrate of the present invention, the silicon film may be formed by using a liquid containing silicon or a gas containing silicon. Here, the silicon film forming step and the heat treatment step may be performed simultaneously.

Further, according to the surface reconstruction method for the silicon carbide substrate of the present invention, the silicon film is preferably formed on an off-plane of the silicon carbide substrate.

Effects of the Invention

In accordance with the present invention, a surface reconstruction method for a silicon carbide substrate can be provided that can more simply close micropipes in a surface of the silicon carbide substrate.

Figure 1:
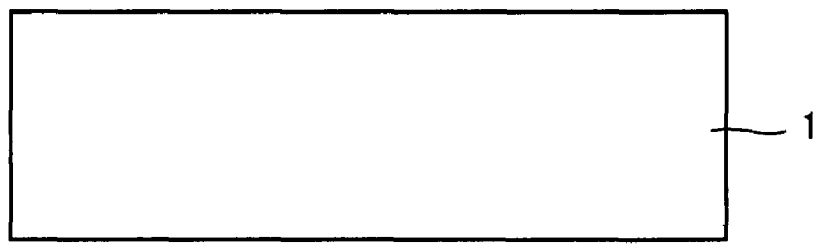
FIG. 1 is a schematic cross section diagrammatically showing a preferred example of a surface reconstruction method for a silicon carbide substrate according to the present invention.
Figure 1:
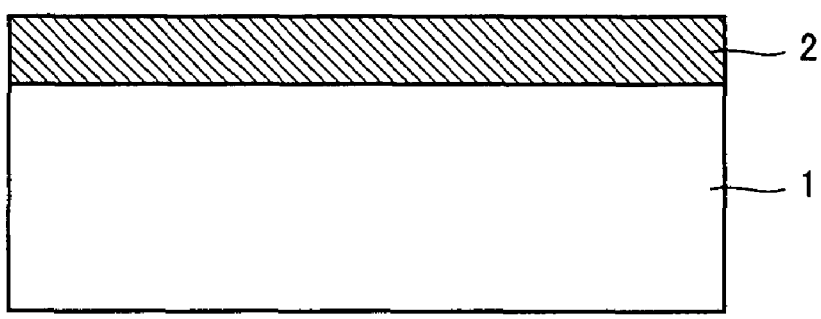
Figure 1:
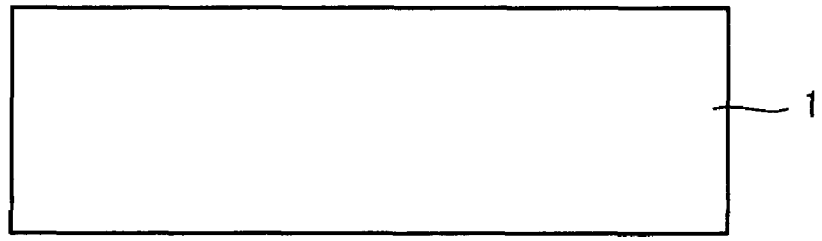

DESCRIPTION OF THE REFERENCE SIGNS 1 silicon carbide substrate, 2 silicon film, 11 substrate holder, 12 spray, 13 hexachlorodisilane, 14 gas supply pipe, 15 gas mixture, 16 vapor deposition apparatus, 17 gas exhaust outlet Best Modes for Carrying Out the Invention In the following, an embodiment of the present invention is described. In the drawings of the present application, the same reference characters represent the same or corresponding components.

In FIGS. 1(A) to (C), a schematic cross section is shown that diagrammatically shows a preferred example of a surface reconstruction method for a silicon carbide substrate according to the present invention. First, as shown in FIG. 1(A), a silicon carbide substrate 1 is prepared. Here, silicon carbide substrate 1 may be obtained by slicing, to a predetermined thickness, a silicon carbide crystal produced for example by the modified Lely method, may be obtained by using a commercially available silicon carbide substrate, or may be obtained by growing a silicon carbide crystal on any substrate. In other words, the silicon carbide substrate used in the present invention is not particularly limited as long as the substrate has a surface made of silicon carbide crystal.

Next, as shown in FIG. 1(B), a silicon film 2 is formed on this silicon carbide substrate 1. Without providing a polycrystalline silicon carbide substrate on the surface of the silicon film, silicon carbide substrate 1 is heat-treated so that micropipes occurring in silicon carbide substrate 1 can be closed. A reason why the micropipes can be closed by the present invention is supposed to be as follows. Silicon film 2 is formed on silicon carbide substrate 1, silicon carbide substrate 1 and silicon film 2 are heat-treated without providing a polycrystalline silicon carbide substrate on the surface of silicon film 2 and accordingly, into openings of micropipes in the surface of silicon carbide substrate 1, carbon atoms are supplied from only silicon carbide substrate 1 without excessive supply of carbon atoms from the outside. Further, silicon atoms are supplied into the openings from silicon film 2. Thus, the surface of silicon carbide substrate 1 is reconstructed to close openings of micropipes without epitaxial growth of single crystal silicon carbide.

To begin with, micropipes are likely to occur in such crystal growth through a rare layer as sublimation and vapor deposition under the conditions that the temperature is high, the surface is in disordered state and energy is stable. The heating after silicon film 2 is formed allows an excessive quantity of silicon atoms to be supplied from silicon film 2 to the surface of silicon carbide substrate 1, so that transport of atoms at the interface between silicon carbide substrate 1 and silicon film 2 can be promoted. In a low-temperature state after the heating, kinks are relatively few in the surface and the arranged and flat surface becomes stable. It is supposed that, for this reason, the surface is reconstructed to close micropipes.

Here, silicon film 2 can be formed easily on silicon carbide substrate 1 by using, for example, sputtering or vapor deposition. Further, silicon film 2 can also be formed by spraying an atomized liquid containing silicon ($Si_2Cl_6$ for example) onto the top of silicon carbide substrate 1 while silicon carbide substrate 1 is heat-treated. Furthermore, silicon film 2 can also be formed by allowing a gas containing silicon ($SiH_2Cl_2$ or $SiCl_4$ for example) to contact the top of silicon carbide substrate 1 while silicon carbide substrate 1 is heat-treated. Thus, by spraying a liquid containing silicon onto the top of silicon carbide substrate 1 which is being heat-treated, or allowing a gas containing silicon to contact the top of silicon carbide substrate 1 which is being heat-treated, the formation of silicon film 2 and the heat treatment of silicon carbide substrate 1 and silicon film 2 can be carried out simultaneously.

The thickness of silicon film 2 formed on silicon carbide substrate 1 may be for example at least 10 nm and at most 1 μm. The temperature at which silicon carbide substrate 1 and silicon film 2 are heat-treated may be, for example, at least 1300° C. and at most 1800° C.

According to the present invention, prior to the formation of silicon film 2, preferably the step is included of planarizing the surface of silicon carbide substrate 1 by etching or polishing the surface. In the case where any flaws remain in the surface of silicon carbide substrate 1, remedy of defects is hindered. Therefore, preferably the planarization is performed to remove flaws in the surface of silicon carbide substrate 1.

Here, the etching can be accomplished by, for example, exposing the surface of silicon carbide substrate 1 to hydrogen or HCl and heating it to a temperature of at least 1300° C. Further, the polishing can be accomplished by, for example, CMP (Chemical Mechanical Polishing).

Preferably, silicon film 2 is formed on an off-plane of silicon carbide substrate 1 which is hexagonal crystal. Here, the off-plane may be formed as a plane inclined with respect to the (0001) plane of hexagonal silicon carbide substrate 1 by 8° for example in the [11-20] direction or [1-100] direction.

Generally, in the case where the off-plane of the (0001) plane of hexagonal silicon carbide substrate 1 is not formed, there is the tendency that a silicon carbide crystal is not grown on the (0001) plane of silicon carbide substrate 1 due to formation of a bicrystal. In contrast, in the case where the off-plane is formed as described above, there is the tendency that, as no bicrystal is formed, a silicon carbide crystal can be grown on the off-plane of silicon carbide substrate 1. Thus, in the case where the silicon film is formed on the off-plane of hexagonal silicon carbide substrate 1, when the silicon film is removed after heat treatment of silicon carbide substrate 1 and silicon film 2, the off-plane of silicon carbide substrate 1 with reduced micropipes can be obtained. Therefore, in the case where this silicon carbide substrate 1 is thereafter used as a substrate for example of a device, there is the tendency that a good-quality silicon carbide crystal can be grown on the surface of the substrate.

Finally, as shown in FIG. 1(C), silicon film 2 on silicon carbide substrate 1 is removed for example by chemical etching with a liquid mixture of hydrofluoric acid and nitric acid for example. Accordingly, silicon carbide substrate 1 with closed micropipes can be obtained. Moreover, according to the present invention, silicon film 2 on silicon carbide substrate 1 may be heated for example in an oxygen atmosphere to generate a silicon oxide film and the silicon oxide film may be chemically etched with hydrofluoric acid for example to remove the silicon oxide film.

EXAMPLES

Example 1

First, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by a method using-light scattering to find that the micropipe density was 96 (micropipes/cm$^2$).

Next, on the off-plane of the silicon carbide substrate, a silicon film was formed by sputtering to a thickness of 100 nm. Then, in a heat-treatment furnace of an argon gas atmosphere at a pressure of $1\times10^5$ Pa, the silicon carbide substrate and the silicon film were heat-treated at 1500° C.

Finally, the silicon film was removed by means of a liquid mixture of hydrofluoric acid and nitric acid. The micropipe density of the off-plane of the silicon carbide substrate from which the silicon film had been removed was checked by the same method as the above-described one. The density decreased to 12 (micropipes/cm$^2$).

Closed micropipes were examined to confirm that the micropipes were closed with silicon carbide.

Example 2

First, as Example 1, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by the same method as that of Example 1 to find that the micropipe density was 92 (micropipes/cm$^2$).

Next, on the off-plane of the silicon carbide substrate, a silicon film was formed by sputtering to a thickness of 100 nm as Example 1. Then, in a heat-treatment furnace of an argon gas atmosphere at a pressure of $1\times10^5$ Pa, the silicon carbide substrate and the silicon film were heat-treated at 1500° C.

Subsequently, in a heat-treatment furnace of an oxygen atmosphere at a pressure of $1\times10^5$ Pa, the silicon carbide substrate and the silicon film were heat-treated at 1300° C. to produce a silicon oxide film from the silicon film on the silicon carbide substrate. Finally, the silicon oxide film was removed by means of hydrofluoric acid. The micropipe density of the off-plane of the silicon carbide substrate from which the silicon oxide film had been removed was checked by the same method as the above-described one. The density decreased to 8 (micropipes/cm$^2$).

Example 3

First, as Example 1, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by the same method as that of Example 1 to find that the micropipe density was 95 (micropipes/cm$^2$).

Figure 2:
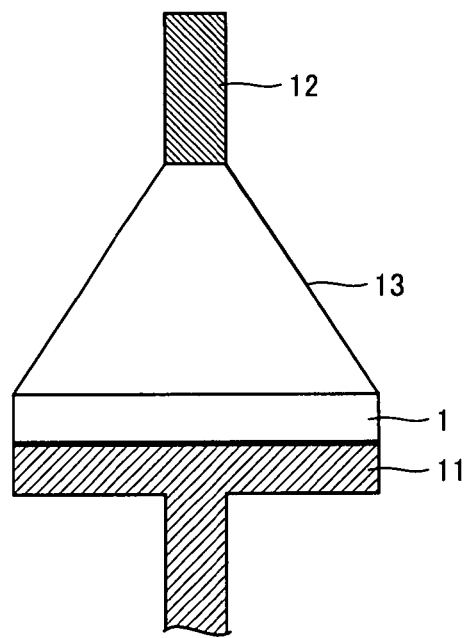
FIG. 2 is a schematic cross section of an apparatus for forming a silicon film used in Example 3 of the present invention.

Next, as shown in the schematic cross section of FIG. 2, onto the off-plane of silicon carbide substrate 1 mounted on a substrate holder 11 and heated to 1500° C. in an argon gas atmosphere at a pressure of $1\times10^5$ Pa, a liquid hexachlorodisilane ($Si_2Cl_6$) 13 as atomized was sprayed from a spray 12. Thus, on the off-plane of silicon carbide substrate 1, hexachlorodisilane 13 was thermally decomposed to form a silicon film on the off-plane of silicon carbide substrate 1 and, simultaneously, silicon carbide substrate 1 and the silicon film were heat-treated. After this, the spray of hexachlorodisilane 13 and the heat treatment of silicon carbide substrate 1 and the silicon film were stopped.

Finally, the silicon film formed on the off-plane of silicon carbide substrate 1 was removed by means of a liquid mixture of hydrofluoric acid and nitric acid. The micropipe density of the off-plane of the silicon carbide substrate from which the silicon film had been removed was checked by the same method as the above-described one. The density decreased to 11 (micropipes/cm$^2$).

Example 4

First, as Example 1, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by the same method as that of Example 1 to find that the micropipe density was 91 (micropipes/cm$^2$).

Figure 3:
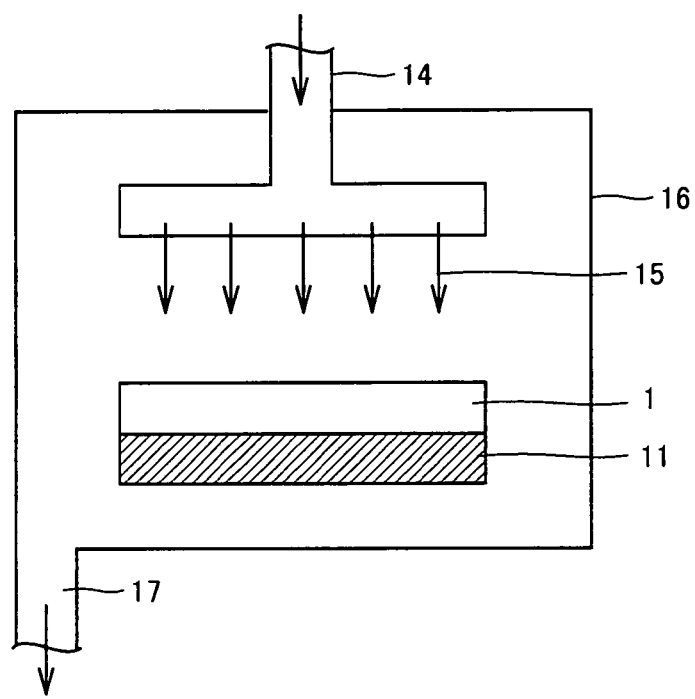
FIG. 3 is a schematic cross section of an apparatus for forming a silicon film used in Example 4 of the present invention.

Next, as shown in the schematic cross section of FIG. 3, a gas mixture 15 of tetrachlorosilane ($SiCl_4$) gas and hydrogen gas which is carrier gas was supplied from a gas supply pipe 14 into a vapor deposition apparatus 16 so that the gas mixture contacted the off-plane of silicon carbide substrate 1 that was mounted on substrate holder 11 and heated to 1300° C. In this way, on the off-plane of silicon carbide substrate 1, the tetrachlorosilane gas and the hydrogen gas reacted with each other to form a silicon film on the off-plane of silicon carbide substrate 1 and simultaneously, silicon carbide substrate 1 and the silicon film were heat-treated. A portion of gas mixture 15 that was not used for the reaction as well as a gas generated from the reaction were discharged from a gas exhaust outlet 17.

Finally, the silicon film formed on the off-plane of silicon carbide substrate 1 was removed by means of a liquid mixture of hydrofluoric acid and nitric acid. The micropipe density of the off-plane of the silicon carbide substrate from which the silicon film had been removed was checked by the same method as the above-described one. The density decreased to 9 (micropipes/cm$^2$).

Example 5

First, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by a method using light scattering to find that the micropipe density was 96 (micropipes/cm$^2$).

Next, the off-plane of the silicon carbide substrate was exposed to hydrogen and heated to 1300° C. so as to etch and planarize the off-plane. After this, on the planarized off-plane, a silicon film was formed by means of sputtering to a thickness of 100 nm. Subsequently, in a heat-treatment furnace of an argon gas atmosphere at a pressure of $1 \times 10^5$ Pa, the silicon carbide substrate and the silicon film were heat-treated at 1500° C.

Finally, the silicon film was removed by means of a liquid mixture of hydrofluoric acid and nitric acid. The micropipe density of the off-plane of the silicon carbide substrate from which the silicon film had been removed was checked by the same method as the above-described one. The density decreased to 7 (micropipes/cm$^2$).

Example 6

First, a silicon carbide substrate made of a commercially available hexagonal silicon carbide crystal and in the shape of a disk with a diameter of two inches was prepared. For an off-plane inclined by 8° in the [11-20] direction with respect to the (0001) plane of the surface of the silicon carbide substrate, the micropipe density (number of micropipes/cm$^2$) was checked by a method using light scattering to find that the micropipe density was 94 (micropipes/cm$^2$).

Next, the off-plane of the silicon carbide substrate was planarized by CMP. After this, on this off-plane, a silicon film was formed by means of sputtering to a thickness of 100 nm. Subsequently, in a heat-treatment furnace of an argon gas atmosphere at a pressure of $1 \times 10^5$ Pa, the silicon carbide substrate and the silicon film were heat-treated at 1500° C.

Finally, the silicon film was removed by means of a liquid mixture of hydrofluoric acid and nitric acid. The micropipe density of the off-plane of the silicon carbide substrate from which the silicon film had been removed was checked by the same method as the above-described one. The density decreased to 4 (micropipes/cm$^2$).

The embodiments and examples herein disclosed are by way of illustration and example in every respect, and are not to be taken by way of limitation. The scope of the present invention is not shown by the description above but by claims, and it is intended that all modifications are included within the meaning and scope equivalent to the claims.

INDUSTRIAL APPLICABILITY

In accordance with the present invention, micropipes in a surface of a silicon carbide substrate can more simply be closed without work and time necessary for such a conventional method as the one using liquid phase epitaxial growth and accordingly, a good-quality silicon carbide substrate with few surface defects can be obtained.

As seen from the above, the silicon carbide substrate obtained according to the present invention can suitably be used for, for example, a power device, environment-resistant device operating at high temperatures or optical device.

What is claimed is:

1. A surface reconstruction method for a silicon carbide substrate, comprising:
    performing planarization by etching or polishing a surface of the silicon carbide substrate;
    subsequently performing a silicon film forming step including forming an elemental silicon film on a surface of the silicon carbide substrate;
    a heat treatment step including heat-treating said silicon carbide substrate and said silicon film, wherein the heat treating is performed at a temperature of at least 1300° C. and at most 1800° C. with carbon atoms being supplied substantially only from the silicon carbide substrate; and
    a silicon film removal step including removing the silicon film after the heat treatment step.

2. The surface reconstruction method for the silicon carbide substrate according to claim 1, wherein said silicon film is formed by sputtering or vapor deposition method.

3. The surface reconstruction method for the silicon carbide substrate according to claim 1, wherein said silicon film is formed by using a liquid containing silicon or a gas containing silicon.

4. The surface reconstruction method for the silicon carbide substrate according to claim 1, wherein said silicon film forming step and said heat treatment step are performed simultaneously.

5. The surface reconstruction method for the silicon carbide substrate according to claim 1, wherein said silicon film is formed on an off-plane of said silicon carbide substrate.

6. The surface reconstruction method for the silicon carbide substrate according to claim 1, wherein a thickness of the silicon film on the silicon carbide substrate is at least 10 nm and at most 1 µm.

7. A surface reconstruction method for a silicon carbide substrate, comprising:
    performing planarization by etching or polishing a surface of the silicon carbide substrate;
    subsequently performing a silicon film forming step including forming an elemental silicon film on a surface of the silicon carbide substrate; and
    a heat treatment step including heat-treating said silicon carbide substrate and the silicon film, wherein the heat treating is performed at a temperature of at least 1300° C. and at most 1800° C. with carbon atoms being supplied substantially only from the silicon carbide substrate;
    a silicon oxide film forming step including oxidizing the silicon film after the heat treatment step to generate a silicon oxide film; and
    subsequently performing a silicon oxide film removal step including removing the silicon oxide film.

* * * * *